(12) United States Patent
Sugihara et al.

(10) Patent No.: US 6,566,734 B2
(45) Date of Patent: May 20, 2003

(54) SEMICONDUCTOR DEVICE

(75) Inventors: Kohei Sugihara, Tokyo (JP); Toshiyuki Oishi, Tokyo (JP); Naruhisa Miura, Tokyo (JP); Yuji Abe, Tokyo (JP); Yasunori Tokuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 11 days.

(21) Appl. No.: 09/809,211

(22) Filed: Mar. 16, 2001

(65) Prior Publication Data

US 2002/0037619 A1 Mar. 28, 2002

(30) Foreign Application Priority Data

Sep. 22, 2000 (JP) ........................................ 2000-288417

(51) Int. Cl.[7] ...................... H01L 29/788; H01L 27/12; H01L 31/117
(52) U.S. Cl. ...................... 257/616; 257/316; 257/321; 257/348
(58) Field of Search ............................... 257/347, 348, 257/330, 616, 194, 192, 316, 321; 438/290, 291

(56) References Cited

U.S. PATENT DOCUMENTS

| | | | | |
|---|---|---|---|---|
| 4,731,339 A | * | 3/1988 | Ryan et al. | 438/172 |
| 5,245,208 A | * | 9/1993 | Eimori | 257/344 |
| 5,576,227 A | * | 11/1996 | Hsu | 438/291 |
| 5,918,130 A | * | 6/1999 | Hause et al. | 438/290 |
| 6,124,614 A | * | 9/2000 | Ryum et al. | |
| 6,207,978 B1 | * | 3/2001 | Fastow | 257/192 |
| 6,326,667 B1 | * | 12/2001 | Sugiyama et al. | 257/347 |
| 6,399,970 B2 | * | 6/2002 | Kubo et al. | 257/194 |
| 6,461,945 B1 | * | 10/2002 | Yu | 438/510 |

OTHER PUBLICATIONS

Matsuo, K. et al.; "Damascene Metal Gate MOSFETs with Co Silicided Source/Drain and High–k Gate Dieletrics", *2000 Symposium on VLSI Tech. Digest of Technical Papers*, IEEE, pp. 70–71 (Jun. 13–15, 2000).

Taur, Y. et al.; "Fundamentals of Modern VLSI Devices", *Cambridge University Press*, pp. 415–417, (1998).

* cited by examiner

*Primary Examiner*—John F. Niebling
*Assistant Examiner*—Ron Pompey
(74) *Attorney, Agent, or Firm*—Leydig, Voit & Mayer, Ltd.

(57) ABSTRACT

In making a field effect transistor, a dummy gate electrode is formed before a gate electrode is formed. Extension regions, a side wall silicon nitride film, source/drain regions, a silicon oxide film, and other elements are formed with respect to the dummy gate electrode. The dummy gate electrode is removed, and a part of the extension regions diffused into a region immediately under the dummy gate electrode is removed. The removed part is filled with silicon selection epitaxial film. Thereafter, the intended gate electrode is formed. This production method produces a field effect transistor that prevents deterioration of electrical characteristics caused by the short channel effect and parasitic resistance.

7 Claims, 20 Drawing Sheets

SEMICONDUCTOR DEVICE

BACKGROUND OF THE INVENTION

1. Field of the Invention

The present invention relates to a semiconductor device and a method of producing the same. In particular, the present invention relates to a method of producing a field effect transistor with stable electrical characteristics, and to a semiconductor device obtained by the production method.

2. Description of the Background Art

One example of a method of producing a conventional field effect transistor will be described with reference to "FUNDAMENTALS OF MODERN VLSI DEVICES", ed. YUAN TAUR et al., Cambridge University Press. With reference to FIG. 45, a p-type well 102 and an element isolation film 103, for example, are formed in a silicon substrate 101. Next, a pad oxide film 104 is formed on the silicon substrate 101. Next, a p-type impurity is ion-implanted to form a channel impurity region 116. Thereafter, the pad oxide film 104 is removed.

Next, a polysilicon film (not illustrated) is formed through the intermediary of a silicon oxide film on the silicon substrate 101. A predetermined photoresist pattern (not illustrated) is formed on the polysilicon film. With the use of the photoresist pattern as a mask, the polysilicon film and the silicon oxide film are subjected to anisotropic etching to form a gate insulation film 117 and a gate electrode 118 referring to FIG. 46. With the use of the gate electrode 118 as a mask, an n-type impurity is ion-implanted to form a pair of extension regions 109a, 109b.

Next, a silicon oxide film (not illustrated) is formed on the silicon substrate 101 so as to cover the gate electrode 118. The entire surface of the silicon oxide film is subjected to anisotropic etching to form side wall silicon oxide films 110 on both side surfaces of the gate electrode 118, as shown in FIG. 47.

Next, referring to FIG. 48, an n-type impurity is ion-implanted with the use of the gate electrode 118 and the side wall silicon oxide film 110 as a mask so as to form a pair of source/drain regions 111a, 111b.

Next, referring to FIG. 49, cobalt silicide films 112a, 112b, 112c are formed in a sell-aligned manner on the surface of the pair of exposed source/drain regions 111a, 111b and the gate electrode 118. Thereafter, referring to FIG. 50, a silicon oxide film 113 is formed on the silicon substrate 101.

Thus, referring to, FIGS. 51 and 52, a field effect transistor including the gate electrode 118, the extension regions 109a, 109b, and the source/drain regions 111a, 111b is formed on an element formation region partitioned by the element isolation film 103. Here, FIG. 51 illustrates a cross-sectional structure in the gate length direction, and FIG. 52 illustrates a cross-sectional structure in the gate width direction.

However, the conventional method of producing a semiconductor device involves the following problems.

The first one of the problems is a problem accompanying the turn-around, i.e., diffusion of impurities into the extension regions 109a, 109b to a region immediately under the gate electrode 118, reversion conductivity type. Referring to FIG. 46, the pair of extension regions 109a, 109b are formed on the surface of the silicon substrate 101 with the use of the gate electrode 118 as a mask. At this time, the ions serving as the impurity may possibly be implanted to turn around to a region under the gate electrode 118.

Further, referring to FIGS. 53 and 54, by a heat treatment in a process after the, extension regions 109a, 109b are formed, the impurity of the extension regions 109a, 109b is diffused to a region under the gate electrode 118, so that the extension regions 109a, 109b are both extended to the region under the gate electrode 118.

By turn-around (diffusion) of the extension regions 109a, 109b to the region immediately under the gate electrode 118, the effective gate length (a) of the field effect transistor will be shorter. When the gate length becomes less than about 100 nm in accordance with the miniaturization of semiconductor devices, the turn-around of about 10 nm of the extension regions 109a, 109b will be a problem, and the short channel effect deteriorates the electrical characteristics in the field effect transistor, such as increase in the sub-threshold current.

Furthermore, referring to FIGS. 53 and 54, the part of the extension regions 109a, 109b formed immediately under the gate electrode 118 and having a comparatively low impurity concentration has a higher electric resistance than the part of the extension regions 109a, 109b located immediately under the side wall dielectric film.

For this reason, the obtained field effect transistor will be equivalent to a field effect transistor in which resistances R are connected in series to the source and the drain, referring to FIG. 55. This makes it hard for the electric current to flow, raising problems such as a slow operation speed.

Next, the second one of the problems is a problem accompanying the rise of impurity concentration in the surface of the channel impurity region 116. In order to meet the miniaturization of field effect transistors, the impurity concentration of the channel impurity region 116 must be raised. The channel impurity region 116 is formed in a step shown in FIG. 45, and the impurity of the channel impurity region 116 will be diffused by a heat treatment in a later-performed process.

In particular, the impurity that diffuses towards the surface of the silicon substrate 101 raises the surface concentration of the channel impurity region 116. Higher surface concentration of the channel impurity region 116 causes rise of the threshold voltage in the field effect transistor.

On the other hand, the semiconductor devices are now designed to have a lower power supply voltage, such as from 5V to 3.3V. In order to meet such a lower power supply voltage, the threshold voltage of the field effect transistor is preferably lower. For this reason, the rise in the threshold voltage of the field effect transistor is against this demand.

Next, the third one of the problems is a problem accompanying the electric field concentration at an end of the element isolation film 103. In order to meet the miniaturization of semiconductor devices, a trench isolation method is employed as an element isolation film 103 for electrically isolating a field effect transistor from other field effect transistors. In the case of an element isolation film 103 formed by the trench isolation method, the electric field of the gate electrode 118 in the neighborhood of the element isolation film 13 is more concentrated than the electric field in the other parts, as shown by B in FIG. 57. By concentration of electric field, a parasitic transistor having a lower threshold voltage is formed in the neighborhood of the element isolation film 103.

In other words, the obtained field effect transistor will be equivalent to a transistor in which the intended transistor T1 is connected in parallel to a parasitic transistor T2, as shown in FIG. 58. Therefore, this parasitic transistor T2 causes the electric current to flow at a lower gate voltage to generate a superfluous leakage current.

SUMMARY OF THE INVENTION

Thus, one object of the present invention is to provide a method of producing a semiconductor device that eliminates the aforesaid problems of the prior art and the other object is to provide a semiconductor device obtained by such a production method.

A method of producing a semiconductor device according to one aspect of the present invention is a method of producing a semiconductor device including an impurity region forming step of forming a pair of impurity regions of first conductivity type on a surface of a semiconductor substrate to sandwich a region that is to become a channel region, and an electrode forming step of forming a gate electrode on the region that is to become the channel region, wherein the method includes a removing step and a filling step. The removing step is for removing a surface of the region that is to become the channel region located immediately under the gate electrode as well as a neighboring part thereof, and a part of the impurity region diffused to a region immediately under the gate electrode. The filling step is for filling the removed surface of the region that is to become the channel region as well as the neighboring part thereof and the removed part of the impurity region, with a predetermined film.

According to this method of producing a semiconductor device, a surface of the region that is to become the channel region located immediately under the gate electrode as well as a neighboring part thereof, and a part of the impurity region diffused to a region immediately under the gate electrode are removed, and the removed parts are filled with a predetermined film, whereby the concentration distribution of the impurity immediately under the gate electrode can be controlled. As a result of this, the threshold voltage of a field effect transistor including a pair of impurity regions and a gate electrode can be controlled, whereby a semiconductor device having excellent electrical characteristics can be obtained.

Preferably, the impurity region forming step includes a step of forming a dummy electrode on the region that is to become the channel region, and a step of introducing an impurity of first conductivity type into the surface of the semiconductor substrate with the use of the dummy electrode as a mask; the method includes a step of removing the dummy electrode between the impurity region forming step and the removing step; the filling step includes a step of forming at least a first silicon epitaxial growth layer as the predetermined film; and the electrode forming step includes a step of forming the gate electrode on a region where the dummy electrode has been removed after the filling step.

In this case, a part of the impurity region that diffuses to a region immediately under the gate electrode by a heat treatment is formed in a region immediately under the dummy electrode before forming an intended gate electrode. The intended gate electrode is formed after the diffused part of the impurity region is removed and filled with the first silicon epitaxial growth layer. This can prevent the effective gate length from becoming shorter in the field effect transistor, and also the parasitic resistance can be eliminated.

Preferably, the filing step includes a step of removing a surface of the first silicon epitaxial growth layer as well as a neighboring part thereof, and a step of further growing a second silicon epitaxial growth layer to fill the removed part of the first silicon epitaxial growth layer.

In this case, the impurity concentration of the region where the channel is to be formed can be controlled more precisely by the second silicon epitaxial growth layer located immediately under the gate electrode, and the threshold voltage of the field effect transistor can be lowered, for example, by allowing the impurity concentration of the second silicon epitaxial growth layer to be lower than the impurity concentration of the first silicon epitaxial growth layer.

Preferably, the method includes a step of introducing an impurity of second conductivity type into the surface of the semiconductor substrate for forming the region that is to become the channel region before the impurity region forming step.

In this case, the surface of the region that is to become the channel region and has a higher impurity concentration by diffusion of the impurity of second conductivity type for restraining the short channel effect in the field effect transistor, as well as the neighboring part thereof, are removed, and the removed part is filled with the first silicon epitaxial growth layer, whereby the impurity concentration of the region immediately under the gate electrode can be controlled, and the threshold voltage of the field effect transistor can be controlled.

Preferably, the filling step includes a step of allowing an impurity concentration of the first silicon epitaxial growth layer to be an impurity concentration of second conductivity type lower than an impurity concentration of the region that is to become the channel region, and the removing step includes a step of forming a trench part having a side part which is forwardly tapered along a direction in which the gate electrode extends.

In this case, by forming a forwardly tapered trench, the region that is to become a channel region having a comparatively high impurity concentration remains immediately under the impurity regions. This can restrain the short channel effect of the field effect transistor.

Still preferably, the method includes a step of forming an isolation region for partitioning the pair of impurity regions and the region that is to become the channel region, and the removing step includes a step of forming a trench part having a side part which is forwardly tapered along a direction from a part where the region that is to become the channel region is in contact with the isolation region towards the region that is to become the channel region.

In this case, the region that is to become a channel region having a comparatively high impurity concentration remains in the region immediately under the gate electrode and near the isolation region. This can restrain formation of a parasitic transistor having a lower threshold voltage accompanying the electric field concentration near the isolation region, thereby to reduce the leakage current.

Preferably, the filling step includes a step of forming a silicon epitaxial growth layer containing an element other than silicon, for example, a Group IV element, as the predetermined film before forming the first silicon epitaxial growth layer.

In this case, a strain is generated in the first epitaxial growth layer by the silicon epitaxial growth layer containing an element other than silicon. This improves the mobility of carriers in the first epitaxial growth layer, and the operation speed of the field effect transistor, for example, is improved.

Specifically, it is preferable that the removing step includes a step of forming a trench part having a side surface and a bottom surface, and the filling step includes a step of forming the silicon epitaxial growth layer containing an element other than silicon at least on the bottom surface of the trench part.

Further, it is preferable that the filling step includes a step of forming the silicon epitaxial growth layer containing an element other than silicon only on the bottom surface of the trench part.

In this case, the strain can be uniformly given to the first epitaxial silicon growth layer.

A semiconductor device according to another aspect of the present invention is a semiconductor device including a pair of impurity regions of a predetermined conductivity type, a gate electrode, a first silicon film, and a second silicon film containing an element other than silicon. The pair of impurity regions of a predetermined conductivity type are formed to be spaced apart from each other in a surface of a silicon substrate. The gate electrode is formed through the intermediary of a gate insulation film on a surface of the semiconductor substrate in a region sandwiched by the pair of impurity regions. The first silicon film and the second silicon film containing an element other than silicon are formed only in the region sandwiched by the pair of impurity regions immediately under the gate electrode; the first silicon film is located immediately under the gate electrode; and the second silicon film containing an element other than silicon is located under the first silicon film and gives a strain to the first silicon film.

According to this structure, a strain is generated in the first silicon film by the second silicon film containing an element other than silicon. This improves the mobility of carriers in the first silicon film, and the operation speed and the like of the field effect transistor including a pair of impurity regions and a gate electrode is improved.

Specifically, it is preferable that the element other than silicon that can give a strain to the first silicon film is a Group IV element or an element having a lattice constant different from that of silicon. Such an element can be easily added into the crystals of silicon.

Preferably, the first silicon film is located over an entire surface of the region sandwiched by the pair of impurity regions immediately under the gate electrode.

In this case, the strain can be uniformly given to the first silicon film in which the carriers move.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A method of producing a semiconductor device including a field effect transistor according to the first embodiment of the present invention will be explained. First, referring to FIG. 1, an element isolation film 3 is formed in a silicon substrate 1 by the trench isolation method. Next, a pad oxide film 4 is formed on the silicon substrate 1. Next, a p-type impurity such as boron or $BF_2$ is implanted through the intermediary of the pad oxide film 4 into the silicon substrate 1 at an implantation energy of 100 KeV to 5 MeV and in a dose amount of $1\times10^{12}$ to $5\times10^{13}$/cm$^2$, so as to form a p-type well 2. Then, the pad oxide film 4 is removed.

Next, a silicon oxide film (not illustrated) is formed on the silicon substrate 1. A polysilicon film (not illustrated) is formed on the silicon oxide film. A silicon oxide film (not illustrated) is formed on the polysilicon film. A photoresist pattern (not illustrated) is formed on the silicon oxide film.

Figure 2:
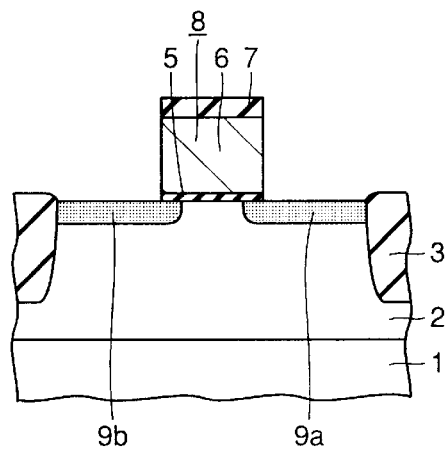
FIG. 2 is a cross-sectional view illustrating a step carried out after the step shown in FIG. 1 in this embodiment.

With the use of the photoresist pattern as a mask, the silicon oxide film, the polysilicon film, and the silicon oxide film are subjected to anisotropic etching so as to form a dummy gate electrode 8 including a polysilicon film 6 and a silicon oxide film 7 through the intermediary of a silicon oxide film 5 on the silicon substrate 1, as shown in FIG. 2.

Next, with the use of the dummy gate electrode 8 as a mask, an n-type impurity such as arsenic or phosphorus is implanted into the silicon substrate 1 at an implantation energy of 0.1 KeV to 20 KeV and in a dose amount of $1\times10^{13}$ to $1\times10^{15}$/cm$^2$, so as to form a pair of extension regions 9a, 9b.

Figure 3:
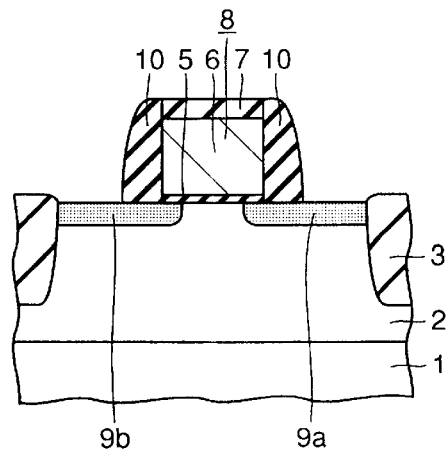
FIG. 3 is a cross-sectional view illustrating a step carried out after the step shown in FIG. 2 in this embodiment.

Next, a silicon nitride film (not illustrated) is formed on the silicon substrate 1 to cover the dummy gate electrode 8. The whole surface of the silicon nitride film is subjected to anisotropic etching so as to form a side wall silicon nitride film 10 on both side surfaces of the dummy gate electrode 8, as shown in FIG. 3.

Figure 4:
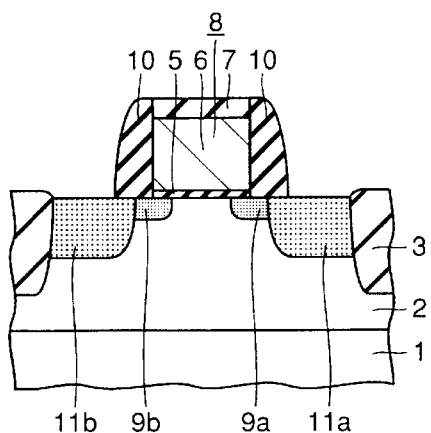
FIG. 4 is a cross-sectional view illustrating a step carried out after the step shown in FIG. 3 in this embodiment.

Next, referring to FIG. 4, with the use of the dummy gate electrode 8 and the side wall silicon nitride film 10 as a mask, an n-type impurity such as arsenic or phosphorus is implanted into the silicon substrate 1 at an implantation energy of 0.5 KeV to 500 KeV and in a dose amount of $5\times10^{14}$ to $5\times10^{15}$/cm$^2$, so as to form a pair of source/drain regions 11a, 11b.

Figure 5:
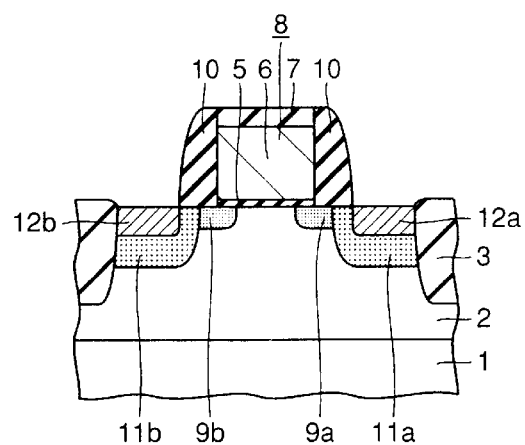
FIG. 5 is a cross-sectional view illustrating a step carried out after the step shown in FIG. 4 in this embodiment.

A cobalt film (not illustrated) is formed, for example, by the sputtering method, to cover the pair of source/drain regions 11a, 11b, the side wall silicon nitride film 10, and the dummy gate electrode 8. Next, referring to FIG. 5, the cobalt film is subjected to a heat treatment at a temperature of 500° C. or 1000° C. in a nitrogen atmosphere or an argon atmosphere, so as to allow the cobalt film to react with silicon in the silicon substrate, thereby to form cobalt silicide films 12a, 12b in a self-aligned manner in the surface of the source/drain regions 11a, 11b, respectively. Then, the unreacted cobalt film is removed.

Figure 6:
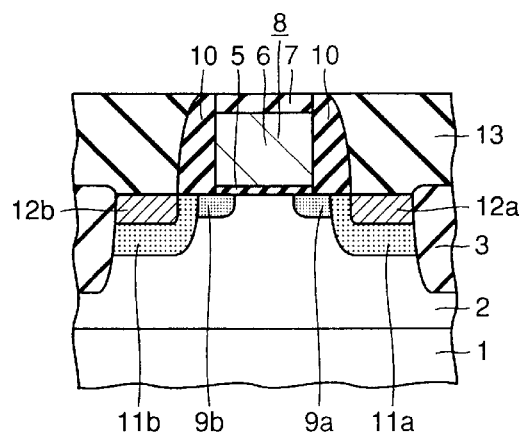
FIG. 6 is a cross-sectional view illustrating a step carried out after the step shown in FIG. 5 in this embodiment.

Next, a silicon oxide film (not illustrated) is formed, for example, by the CVD method, to cover the cobalt silicide films 12a, 12b, the side wall silicon nitride film 10, and the dummy gate electrode 8. The silicon oxide film is subjected, for example, to a chemical mechanical polishing treatment or a whole surface etching-back treatment, so as to planarize the surface of the silicon oxide film 13 and to expose the surface of the silicon oxide film 7, as shown in FIG. 6.

In the meantime, from the time of forming the extension regions 9a, 9b in the step shown in FIG. 2 till this step, for example, at the time of forming the silicon oxide film 13 or the silicon nitride film 10, the silicon substrate 1 is exposed to an atmosphere of a predetermined temperature, or a heat treatment or the like is carried out on the silicon substrate 1 for activating the impurity implanted into the source/drain regions 11a, 11b.

Figure 54:
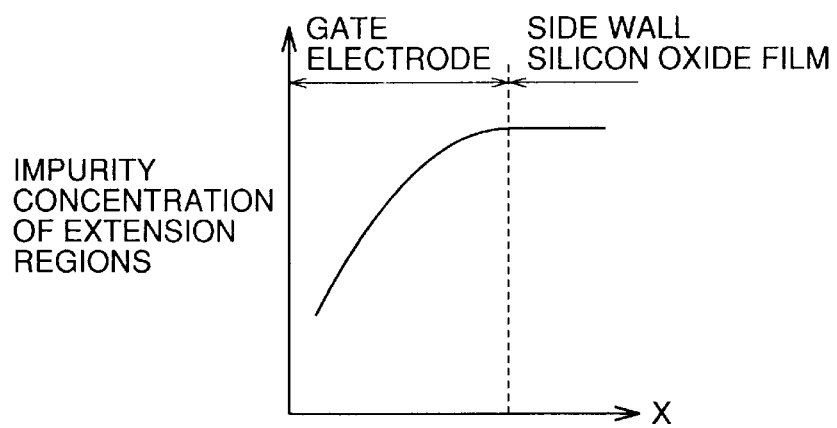
FIG. 54 is a view illustrating an impurity concentration profile of extension regions in the semiconductor device shown in FIG. 51.
Figure 55:
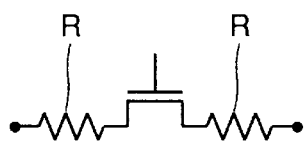
FIG. 55 is a view illustrating one equivalent circuit of a field effect transistor in a conventional semiconductor device.
Figure 56:
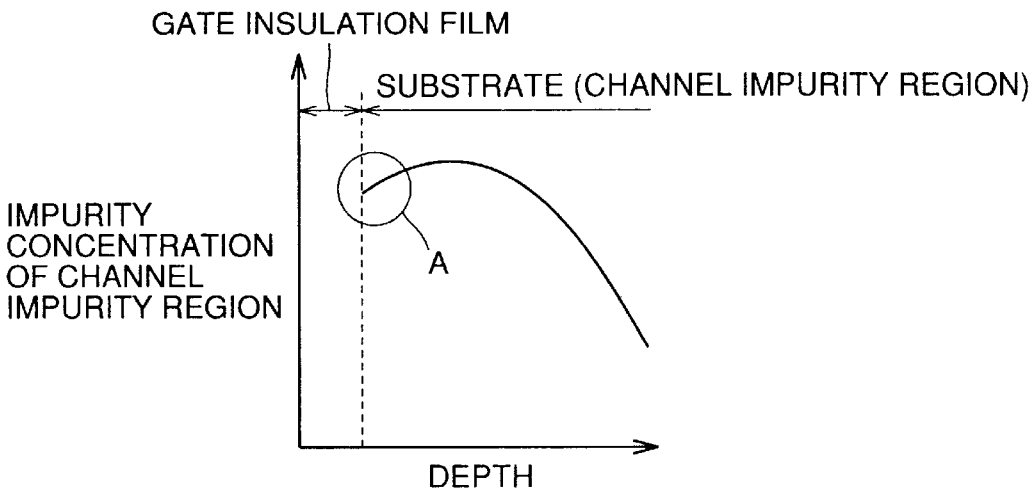
FIG. 56 is a view illustrating an impurity concentration profile of a channel impurity region of the semiconductor device shown in FIG. 51.
Figure 57:
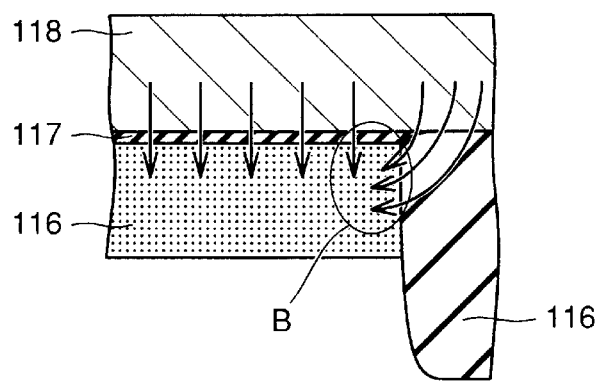
FIG. 57 is a partial enlarged cross-sectional view of the semiconductor device shown in FIG. 52.
Figure 58:
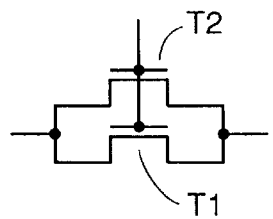
FIG. 58 is a view illustrating another equivalent circuit of a field effect transistor in a conventional semiconductor device.

For this reason, among the impurity of the extension regions 9a, 9b diffused by such heat, the impurity that diffuses along the surface of the silicon substrate 1 reaches a region immediately under the dummy gate electrode 8, whereby a part of the extension regions 11a, 11b having a comparatively low impurity concentration is formed in the region immediately under the dummy gate electrode 8 (See FIG. 54).

Figure 7:
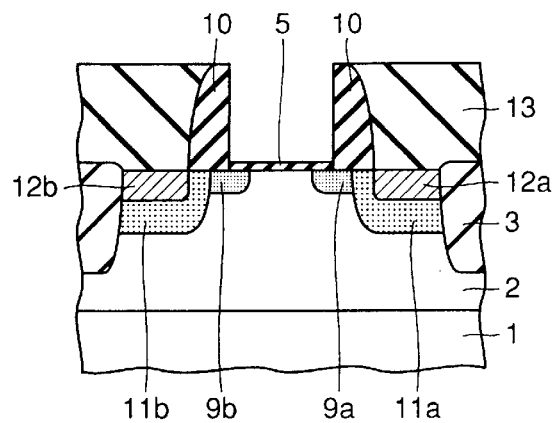
FIG. 7 is a cross-sectional view illustrating a step carried out after the step shown in FIG. 6 in this embodiment.

Next, referring to FIG. 7, the silicon oxide film 7 and the polysilicon film 6 are removed while substantially leaving the side wall silicon nitride film 10, thereby to expose the surface of the silicon oxide film 5. Specifically, the silicon oxide film 7 is removed, for example, by wet etching with hydrofluoric acid (HF), to expose the surface of the polysilicon film G. At this time, the surface of the silicon oxide film 13 is also etched.

Here, the silicon oxide film 7 may be removed by carrying out dry etching in an atmosphere containing carbon tetrafluoride ($CF_4$), argon (Ar), and oxygen ($O_2$), instead of the wet etching.

Next, the polysilicon film 6 is removed, for example, with an etchant containing hydrofluoric acid and nitric acid ($HNO_3$) so as to expose the surface of the silicon oxide film 5. Here, the polysilicon film 6 may be removed with an etchant containing ammonium hydroxide ($NH_4OH$), hydrogen peroxide ($H_2O_2$), and water ($H_2O$), or with hydrofluoric acid, instead of the etchant containing hydrofluoric acid and nitric acid.

Figure 8:
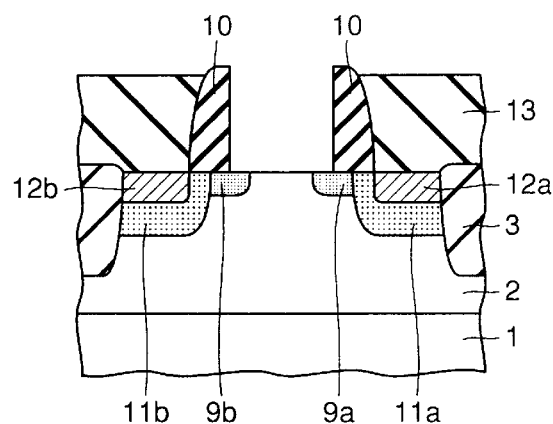
FIG. 8 is a cross-sectional view illustrating a step carried out after the step shown in FIG. 7 in this embodiment.

Next, referring to FIG. 8, the exposed silicon oxide film 5 is removed, for example, with hydrofluoric acid. The surface of the region that is to become the channel region and the surface of the part of the extension regions that diffuses to a region immediately under the dummy gate electrode 8 (both being surfaces of the silicon substrate 1) are exposed by this removal of the silicon oxide film 5.

Figure 9:
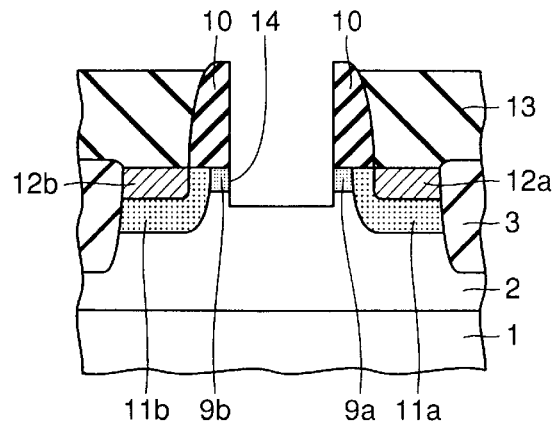
FIG. 9 is a cross-sectional view illustrating a step carried out after the step shown in FIG. 8 in this embodiment.

Next, referring to FIG. 9, the exposed surface of the silicon substrate 1 is subjected to etching to form a trench 14 thereby to remove the part of the extension regions that diffuses to a region immediately under the dummy gate electrode 8. It is sufficient that the trench 14 is a trench having a depth larger than the depth of this part of the extension regions and may sufficiently have a depth of up to about 100 nm.

Here, the etching condition is preferably the same as the aforesaid condition for removing the polysilicon film.

Figure 10:
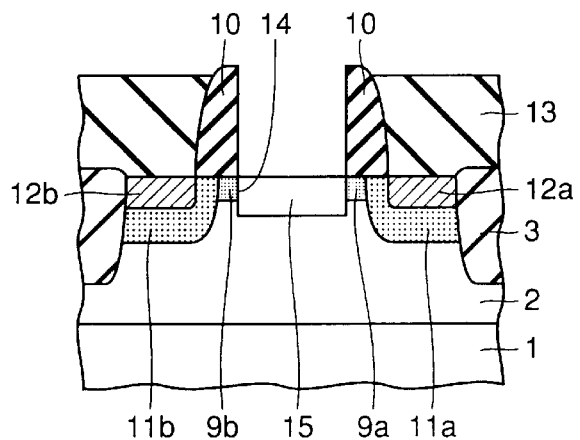
FIG. 10 is a cross-sectional view illustrating a step carried out after the step shown in FIG. 9 in this embodiment.

Next, referring to FIG. 10, a silicon selection epitaxial film 15 is formed in the trench 14 selectively with respect to the silicon oxide film 13 and the side wall silicon nitride film 10. Specifically, the silicon selection epitaxial film 15 is formed, for example, by the chemical vapor deposition method under super high vacuum with a silicon substrate 1 temperature of 400 to 900° C., a disilane ($Si_2H_6$) flow rate of 1 to 10 sccm, and a chlorine ($Cl_2$) flow rate of 1 to 10 sccm. A channel will be formed in this silicon selection epitaxial film 15.

Figure 11:
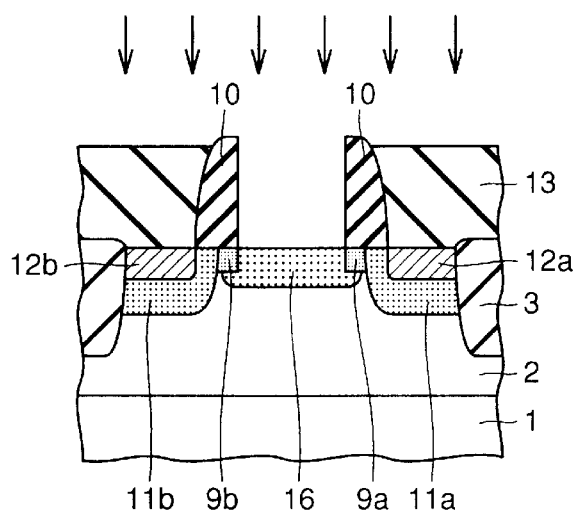
FIG. 11 is a cross-sectional view illustrating a step carried out after the step shown in FIG. 10 in this embodiment.

Next, referring to FIG. 11, a p-type impurity such as boron or $BF_2$ is implanted into the exposed silicon selection epitaxial film 15 at an implantation energy of 5 KeV to 50 KeV and in a dose amount of $5 \times 10^{10}$ to $1 \times 10^{12}/cm^2$, so as to form a channel impurity region 16.

Here, the step of ion implantation shown in FIG. 11 can be omitted by forming a silicon selection epitaxial film containing a p-type impurity as the silicon selection epitaxial film 15 formed in the step shown in FIG. 10.

Figure 12:
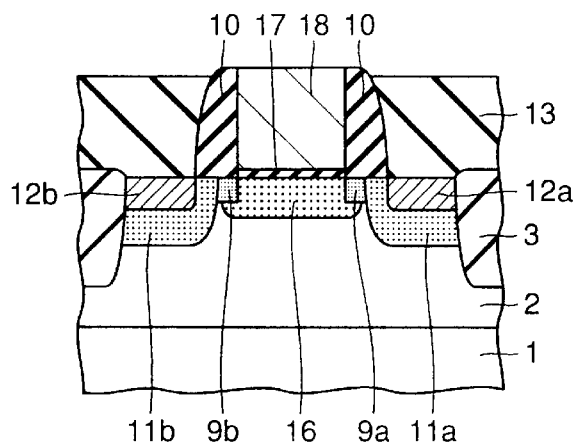
FIG. 12 is a cross-sectional view illustrating a step carried out after the step shown in FIG. 11 in this embodiment.

Next, referring to FIG. 12, a gate insulation film 17, for example, of silicon oxide film is formed on the channel impurity region 16. A gate electrode 18, for example, of polysilicon film is formed on the gate insulation film 17.

Here, as the gate insulation film, a silicon oxide nitride film may be formed instead of the silicon oxide film. Further, a film made of a high dielectric constant material such as tantalum oxide may be formed. As the gate electrode, a silicon germanium film, a silicide film, or a metal film may be formed instead of the polysilicon film. Further, a laminate film of these may be formed.

Through these steps, a field effect transistor including the gate electrode 18, the pair of extension regions 9a, 9b, and the source/drain regions 11a, 11b is formed. Thereafter, through a contact hole forming step, a wiring forming step, and others, the principal part of a semiconductor device including the field effect transistor is completed.

In the aforesaid production method, the dummy gate electrode 8 is formed first before forming the gate electrode 18. The extension regions 9a, 9b, the side wall silicon nitride film 10, the source/drain regions 11a, 11b, the silicon oxide film 13, and others are formed with respect to the dummy gate electrode 8.

By a heat treatment carried out on the silicon substrate 1 from the time of forming the extension regions 9a, 9b till the time of forming the silicon oxide film 13, the impurity in the extension regions 9a, 9b diffuses to a region immediately under the dummy gate electrode 8. This process forms a part of the extension regions having a comparatively low impurity concentration in the region immediately under the dummy gate electrode 8.

This part of the extension regions 9a, 9b located immediately under the dummy gate electrode 8 is removed, and the silicon selection epitaxial film 15 is formed in the removed part. Thereafter, the dummy gate electrode 8 is removed, and the intended gate electrode 18 is formed.

Thus, in this method of producing a semiconductor device, the part of the extension regions 9a, 9b that diffuses to a region immediately under the gate electrode is formed by the heat treatment in the region immediately under the dummy gate electrode 8 before forming the intended gate electrode 18. The intended gate electrode 8 is formed after the diffused part of the extension regions 9a, 9b is removed and filled with the silicon selection epitaxial film 15. This can prevent the effective gate length from becoming shorter in the field effect transistor. Also, the parasitic resistance can be reduced. This can prevent deterioration of electrical characteristics caused by the short channel effect or the parasitic resistance.

Here, even after the intended gate electrode 18 is formed, the impurity of the extension regions 9a, 9b diffuses to some extent by carrying out a heat treatment on the silicon substrate 1 that accompanies the process.

However, the heat treatment carried out after forming the intended gate electrode 18 is sufficiently less than the heat treatment carried out in the conventional method of producing a semiconductor device in which the intended gate electrode is formed from the beginning.

For this reason, by this method of producing a semiconductor device according to the present invention, the diffusion of the extension regions 9a, 9b is little, and an effect of preventing the effective gate length from becoming shorter and an effect of reducing the parasitic resistance can be obtained.

Second Embodiment

Figure 13:
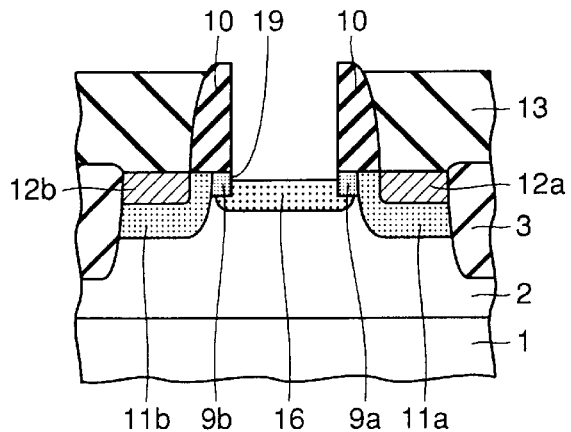
FIG. 13 is a cross-sectional view illustrating one step in a method for producing a semiconductor device according to a second embodiment of the present invention.

A method of producing a semiconductor device according to the second embodiment of the present invention will be explained. First, the process goes through steps similar to those from the step shown in FIG. 1 to the step shown in FIG. 11 explained in the first embodiment. Thereafter, referring to FIG. 13, wet etching or dry etching is carried out to remove the exposed surface of the channel impurity region 16 as well as the neighboring part thereof to form a trench 19. The thickness of the removed part (depth of the trench 19) is preferably less than about 50 nm.

Figure 14:
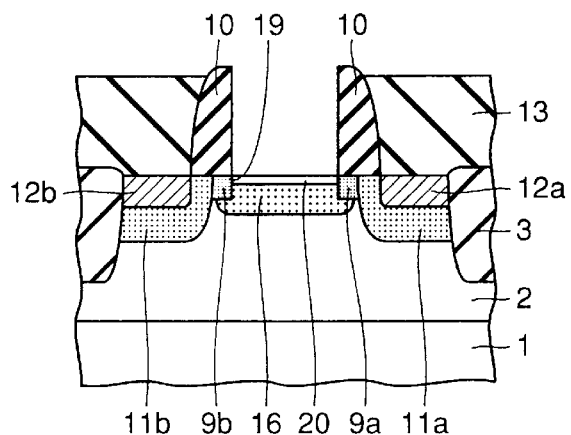
FIG. 14 is a cross-sectional view illustrating a step carried out after the step shown in FIG. 13 in this embodiment.

Next, referring to FIG. 14, a silicon selection epitaxial film 20 is formed in the trench 19 selectively with respect to the silicon oxide film 13 and the side wall silicon nitride film 10. Specifically, the silicon selection epitaxial film 20 is formed, for example, by the chemical vapor deposition method under super high vacuum with a silicon substrate 1 temperature of 400 to 900° C., a disilane ($Si_2H_6$) flow rate of 1 to 10 sccm, and a chlorine ($Cl_2$) flow rate of 1 to 10 sccm.

This silicon selection epitaxial film 20 may be one doped with a p-type impurity.

In the case of doping the silicon selection epitaxial film 20, it may be doped during the epitaxial growth or by the ion implantation method after the silicon selection epitaxial film 20 is formed. The impurity concentration of the silicon selection epitaxial film 20 is lower than the impurity concentration of the channel impurity region 16. Alternatively, the silicon selection epitaxial film 20 may be a non-doped one without the addition of impurities.

Figure 15:
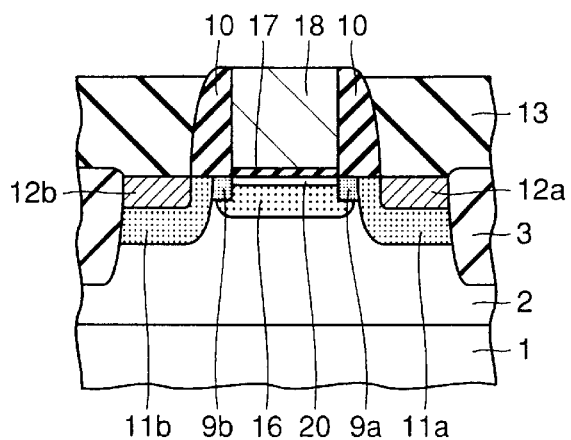
FIG. 15 is a cross-sectional view illustrating a step carried out after the step shown in FIG. 14 in this embodiment.

Next, referring to FIG. 15, a gate insulation film 17 is formed on the silicon selection epitaxial film 20. A gate electrode 18 is formed on the gate insulation film 17. Thereafter, through a contact hole forming step, a wiring forming step, and others (none illustrated), the principal part of a semiconductor device including the field effect transistor is completed.

As described above, by this method of producing a semiconductor device, the impurity concentration of the region that is to become the channel region can be controlled more precisely by forming the silicon selection epitaxial film 20 in the surface of the silicon substrate 1 in the region immediately under the gate electrode 18, and the rise of the threshold voltage in the field effect transistor can be restrained, for example, by forming a silicon selection epitaxial film 20 having a lower impurity concentration than the impurity concentration of the channel impurity region 16, thereby making it possible to meet the decrease in the power supply voltage of the semiconductor device.

Here, as the field effect transistor of n-channel type, the silicon selection epitaxial film 20 is doped with a p-type impurity; however, it may be doped with an n-type impurity or may be ion-implanted. In this case, an n-type region is formed in the surface of the silicon substrate 1 in a region immediately under the gate electrode 18, whereby a transistor of buried channel type is formed as the field effect transistor.

Third Embodiment

A method of producing a semiconductor device according to the third embodiment of the present invention will be explained.

Figure 1:
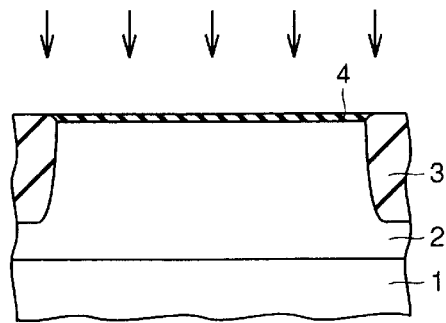
FIG. 1 is a cross-sectional view illustrating one step in a method for producing a semiconductor device according to a first embodiment of the present invention.
Figure 16:
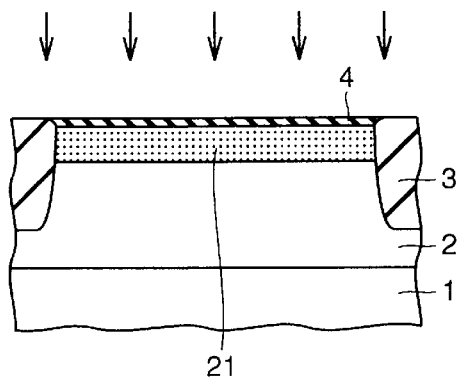
FIG. 16 is one cross-sectional view illustrating one step in a method for producing a semiconductor device according to a third embodiment of the present invention.
Figure 17:
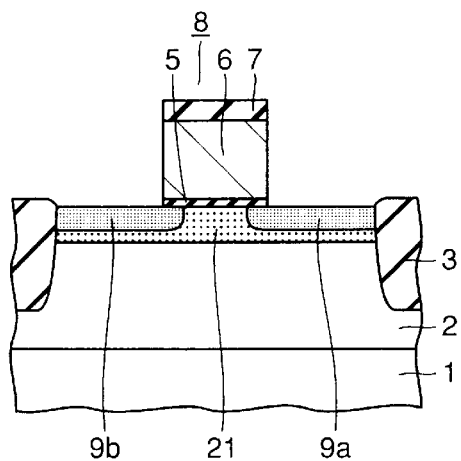
FIG. 17 is a cross-sectional view illustrating a step carried out after the step shown in FIG. 16 in this embodiment.
Figure 18:
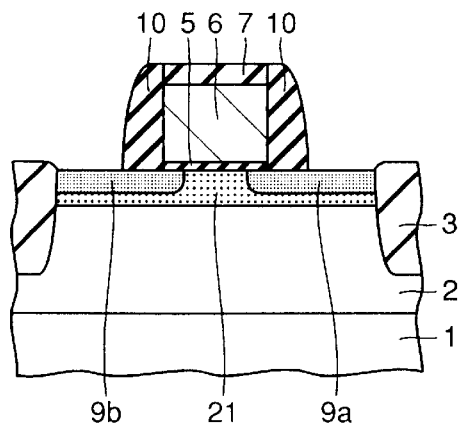
FIG. 18 is a cross-sectional view illustrating a step carried out after the step shown in FIG. 17 in this embodiment.
Figure 19:
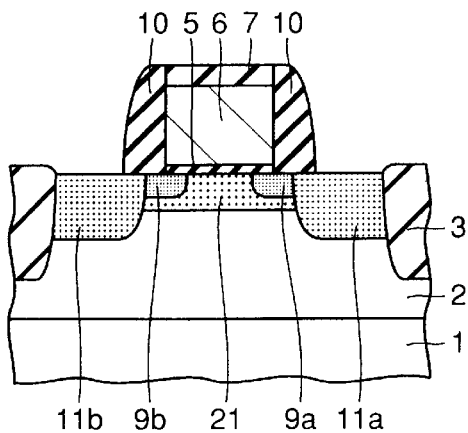
FIG. 19 is a cross-sectional view illustrating a step carried out after the step shown in FIG. 18 in this embodiment.
Figure 20:
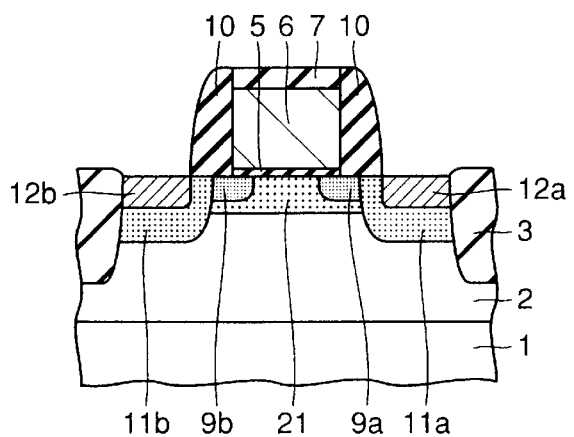
FIG. 20 is a cross-sectional view illustrating a step carried out after the step shown in FIG. 19 in this embodiment.
Figure 21:
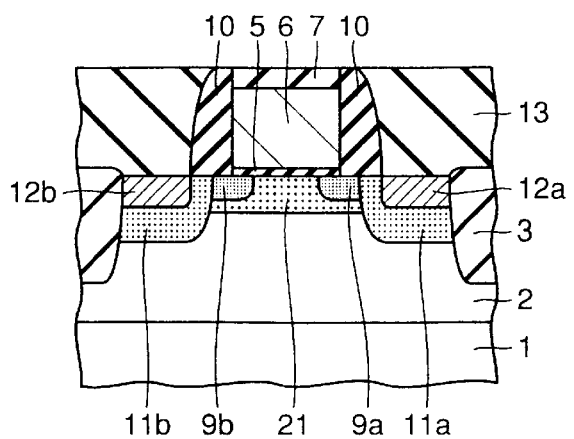
FIG. 21 is a cross-sectional view illustrating a step carried out after the step shown in FIG. 20 in this embodiment.
Figure 22:
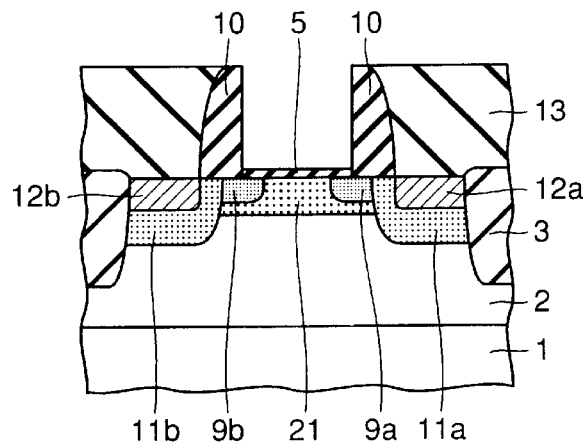
FIG. 22 is a cross-sectional view illustrating a step carried out after the step shown in FIG. 21 in this embodiment.

First, in a step similar to the step shown in FIG. 1 and explained in the first embodiment, a p-type impurity such as boron or $BF_2$ is implanted into the surface of the silicon substrate 1 at an implantation energy of 5 KeV to 50 KeV and in a dose amount of $5 \times 10^{10}$ to $1 \times 10^{12}/cm^2$, so as to form a channel impurity region 21, as shown in FIG. 16.

Figure 23:
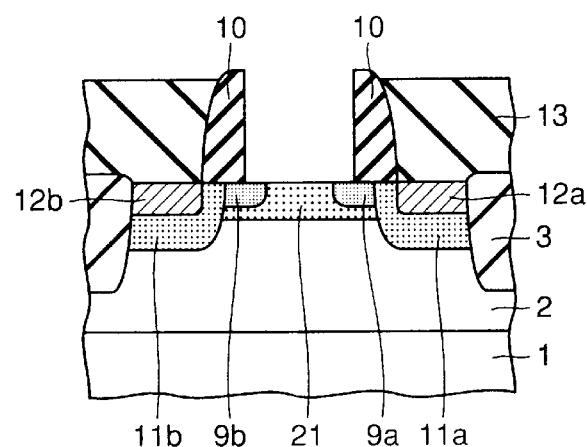
FIG. 23 is a cross-sectional view illustrating a step carried out after the step shown in FIG. 22 in this embodiment.

Thereafter, the process goes through the steps shown in FIGS. 17 to 22 to generate a state in which the dummy gate electrode has been removed, as shown in FIG. 23. Here, since the steps during this process is similar to the steps shown in FIGS. 2 to 8 and explained in the first embodiment, a detailed explanation will be omitted.

Figure 24:
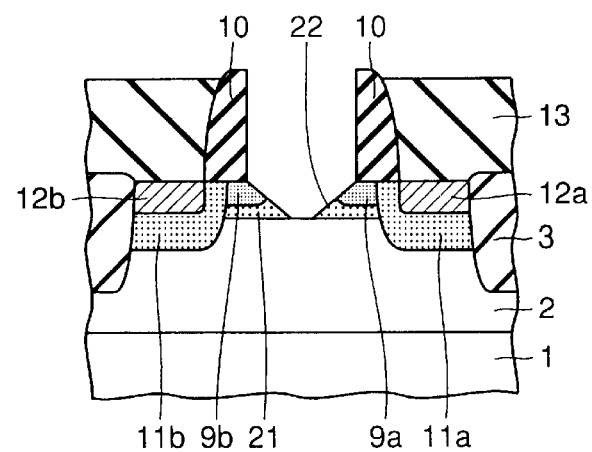
FIG. 24 is a cross-sectional view illustrating a step carried out after the step shown in FIG. 23 in this embodiment.
Figure 25:
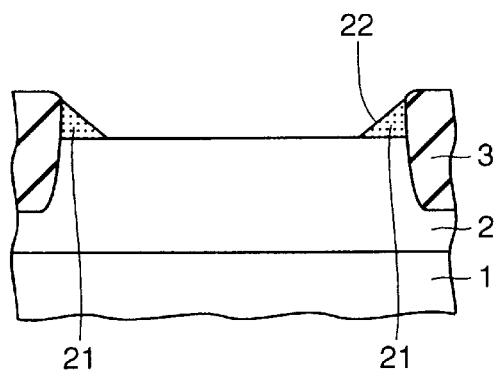
FIG. 25 is another cross-sectional view illustrating the step shown in FIG. 24 in this embodiment.

Next, referring to FIGS. 24 and 25, a forwardly tapered trench 22 is formed in an exposed region immediately under the gate electrode (the surface of the silicon substrate 1), for example, by wet etching using an etchant containing KOH. Here, FIG. 25 shows a cross-sectional structure parallel to the direction in which the gate electrode extends.

It is sufficient that the taper angle of the trench 22 (the angle formed by the surface of the silicon substrate 1 and the trench 22) is larger than 0° and smaller than 90°. Also, it is sufficient that at least a bottom part of the trench 22 has a tapered shape. By forming such a trench 22, the surface part of the channel impurity region 21 is removed.

Figure 26:
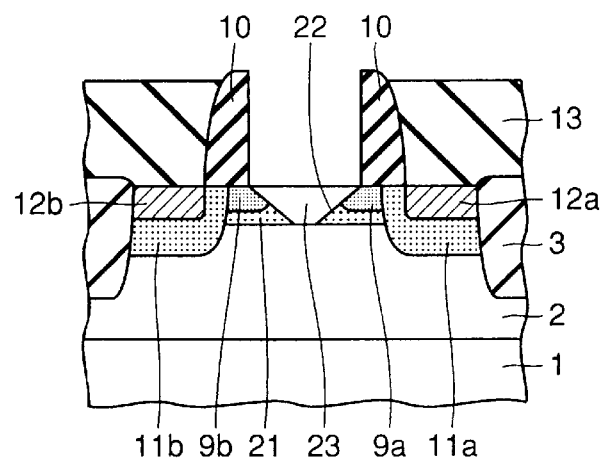
FIG. 26 is a cross-sectional view illustrating a step carried out after the step shown in FIG. 24 in this embodiment.
Figure 27:
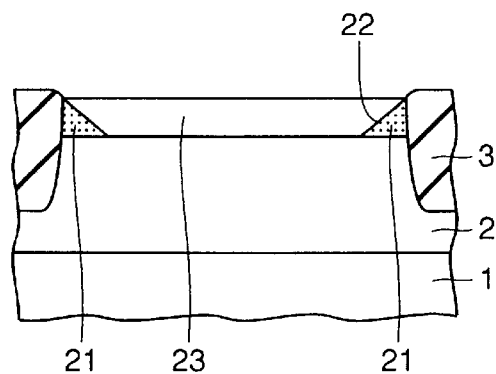
FIG. 27 is another cross-sectional view illustrating the step shown in FIG. 26 in this embodiment.

Next, referring to FIGS. 26 and 27, a silicon selection epitaxial film 23 is formed in the trench 22 selectively with respect to the silicon oxide film 13 and the side wall silicon nitride film 10. Specifically, the silicon selection epitaxial film 23 is formed, for example, by the chemical vapor deposition method under super high vacuum with a silicon substrate 1 temperature of 400 to 900° C., a disilane ($Si_2H_6$) flow rate of 1 to 10 sccm, and a chlorine ($Cl_2$) flow rate of 1 to 10 sccm.

Figure 28:
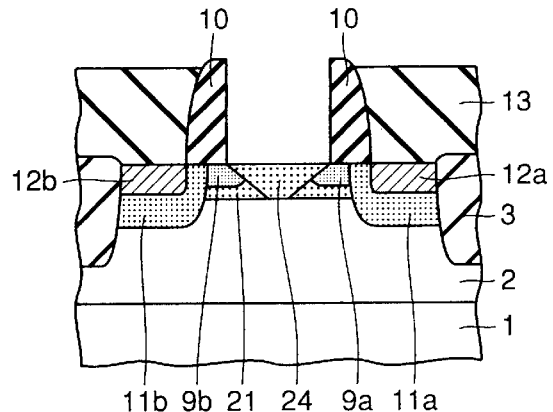
FIG. 28 is a cross-sectional view illustrating a step carried out after the step shown in FIG. 26 in this embodiment.
Figure 29:
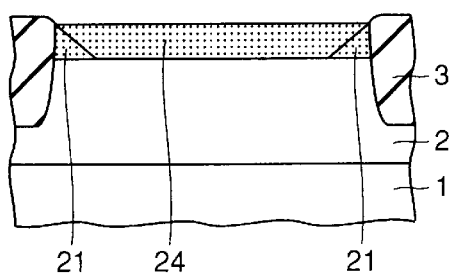
FIG. 29 is another cross-sectional view illustrating the step shown in FIG. 28 in this embodiment.

Next, referring to FIGS. 28 and 29, a p-type impurity is implanted into the silicon selection epitaxial film 23 by the ion implantation method, so as to form a channel impurity region 24. The impurity concentration of the channel impurity region 24 is lower than the impurity concentration of the channel impurity region 21.

Figure 30:
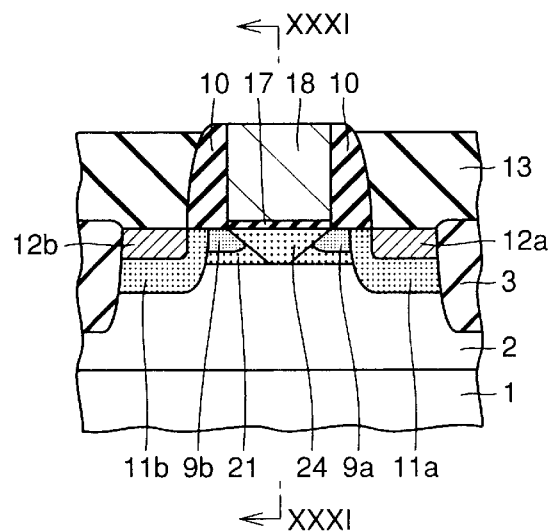
FIG. 30 is a cross-sectional view illustrating a step carried out after the step shown in FIG. 28 in this embodiment.
Figure 31:
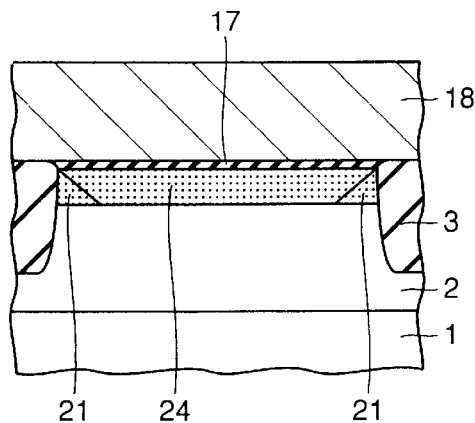
FIG. 31 is another cross-sectional view illustrating the step shown in FIG. 30 in this embodiment.

Next, referring to FIGS. 30 and 31, a gate insulation film 17 is formed on the channel impurity region 24. A gate electrode 18 is formed on the gate insulation film 17. Thereafter, through a contact hole forming step, a wiring forming step, and others (none illustrated), the principal part of a semiconductor device including the field effect transistor is completed.

According to this method of producing a semiconductor device, the channel impurity region 22 having a lower impurity concentration than the impurity concentration of the channel impurity region 21 is formed in the surface of the silicon substrate 1 in a region immediately under the gate electrode 18. This can restrain rise of the threshold voltage in the field effect transistor and makes it possible to meet the decrease in the power supply voltage of the semiconductor device.

Further, by forming a forwardly tapered trench 22 as shown in FIG. 26, the channel impurity region 21 having a higher impurity concentration is left under the extension regions 9a, 9b. This can restrain the short channel effect in the field effect transistor.

Further, by forming a tapered trench 22 as shown in FIG. 27, the channel impurity region 21 having a higher impurity concentration is left particularly in the neighborhood of the element isolation film 3.

For this reason, in the width direction of the gate electrode 18 of the field effect transistor, the channel impurity region 21 having a higher impurity concentration is present in a larger amount in a region immediately under both end parts adjacent to the element isolation film 3 than in the neighborhood of the region immediately under the center of the gate electrode 18, as shown in FIG. 31.

As described in the problems of the prior art, by the element isolation film 3 of trench isolation type, the electric field of the gate electrode 18 near the element isolation film 3 is concentrated more than the electric field of the other parts. By concentration of the electric field, a parasitic transistor having a lower threshold voltage is formed in the neighborhood of the element isolation film 3.

In this field effect transistor, among the region immediately under the gate electrode 18, the channel impurity region 21 having a higher impurity concentration is present in a larger amount in the part adjacent to the element isolation film 3. Therefore, the decrease of the threshold voltage accompanying the electric field concentration in the neighborhood of the element isolation film 3 is restrained by the presence of the channel impurity region 21 having a higher impurity concentration. As a result of this, a parasitic transistor having a lower threshold voltage can be prevented from being formed.

Here, explanation has been given on the case in which the tapered trench 22 is formed by carrying out wet etching with KOH; however, the tapered trench can be formed by carrying out dry etching with $HBr/O_2$ gas instead of wet etching. In this case, if the amount of $O_2$ is comparatively large, a reaction product adheres to the etched side wall to inhibit etching, so that a taper is more easily formed. Also, by addition of tetrachlorosilane ($SiCl_4$), the reaction product adheres in a larger amount to the side wall to facilitate formation of a tapered trench.

Fourth Embodiment

A method of producing a semiconductor device according to the fourth embodiment of the present invention will be explained. First, the process goes through the steps similar to the steps shown in FIGS. 1 to 8 and explained in the first embodiment of the present invention. Thereafter, referring to FIG. 32, the exposed surface of the silicon substrate 1 is subjected to etching to form a trench 25, thereby to remove a part of the extension regions 9a, 9b that diffuses to a region immediately under the dummy gate electrode 8. As described later, it is sufficient that the depth of the trench 25 is a depth such that a strain can be given to the silicon selection epitaxial growth film, and is preferably less than about 250 nm.

Figure 33:
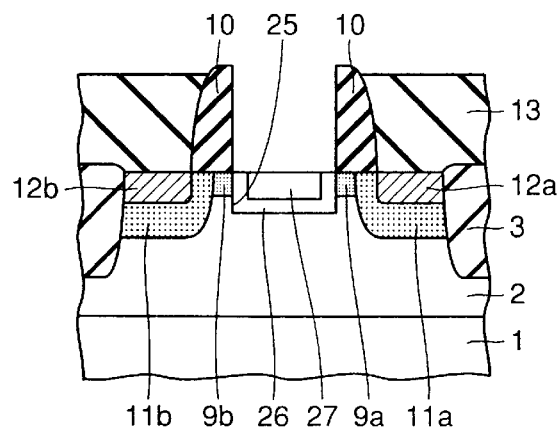
FIG. 33 is a cross-sectional view illustrating a step carried out after the step shown in FIG. 32 in this embodiment.

Next, referring to FIG. 33, a silicon germanium selection epitaxial film 26 is formed on the bottom surface and on the side surface of the trench 25 selectively with respect to the silicon oxide film 13 and the side wall silicon nitride film 10. Specifically, the silicon germanium selection epitaxial film 26 is formed, for example, by the chemical vapor deposition method under super high vacuum with a silicon substrate 1 temperature of 400 to 900° C., a germane ($GeH_4$) flow rate of 1 to 10 sccm, a disilane ($Si_2H_6$) flow rate of 1 to 10 sccm, and a chlorine ($Cl_2$) flow rate of 1 to 10 sccm.

Next, a silicon selection epitaxial film 27 is formed selectively on the silicon germanium selection epitaxial film 26. Specifically, the silicon selection epitaxial film 27 is formed, for example, by the chemical vapor deposition method under super high vacuum with a silicon substrate 1 temperature of 400 to 900° C., a disilane ($Si_2H_6$) flow rate of 1 to 10 sccm, and a chlorine ($Cl_2$) flow rate of 1 to 10 sccm.

Figure 34:
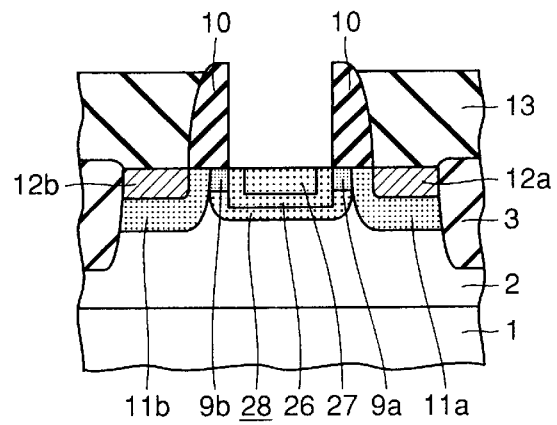
FIG. 34 is a cross-sectional view illustrating a step carried out after the step shown in FIG. 33 in this embodiment.

Next, referring to FIG. 34, a p-type impurity is implanted into the silicon selection epitaxial film 27 and the silicon germanium selection epitaxial film 26 by the ion implantation method, so as to form a channel impurity region 28.

Figure 35:
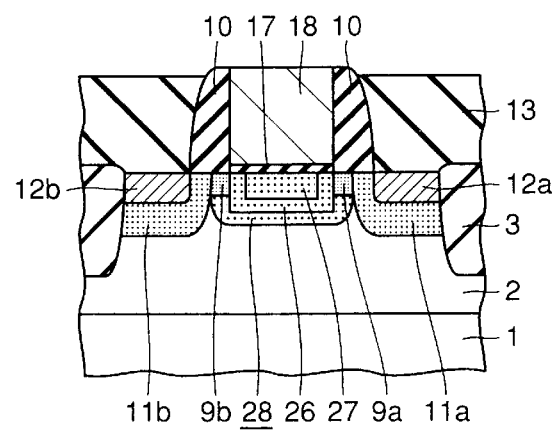
FIG. 35 is a cross-sectional view illustrating a step carried out after the step shown in FIG. 34 in this embodiment.

Next, referring to FIG. 35, a gate insulation film 17 is formed on the channel impurity region 28. A gate electrode 18 is formed on the gate insulation film 17. Thereafter, through a contact hole forming step, a wiring forming step, and others (none illustrated), the principal part of a semiconductor device including the field effect transistor is completed.

According to this method of forming a semiconductor device, the silicon selection epitaxial film 27 is formed selectively on the silicon germanium selection epitaxial film 26, as shown in FIG. 33. Here, the lattice constant of silicon is 0.543 nm (5.43 Å), and the lattice constant of germanium is 0.566 nm (5.66 Å) ("Chemical Handbook", Maruzen Co., Ltd.). This allows the silicon germanium selection epitaxial film 27, in which germanium is added to silicon, to have a lattice constant between the lattice constant of silicon and the lattice constant of germanium.

Thus, since the silicon germanium selection epitaxial film 26 and the silicon selection epitaxial film 27 have different lattice constants, strain is generated in the silicon selection epitaxial film 27 which is in contact with the silicon germanium selection epitaxial film 26. In the silicon selection epitaxial film 27 in which the strain is generated, the mobility of carriers (electrons or positive holes) is raised as compared with a silicon selection epitaxial film in which the strain is not generated. As a result of this, the performance of the transistor is raised, such as an improvement of operation speed.

Here, the strain imposed on the silicon selection epitaxial film can be adjusted by the compositional ratio of the silicon germanium selection epitaxial film. According as the compositional ratio of germanium increases, the lattice constant of the silicon germanium selection epitaxial film becomes nearer to the lattice constant of germanium, and a larger strain is imposed on the silicon selection epitaxial film.

Further, as the film that gives a strain to the silicon selection epitaxial film, the silicon germanium selection epitaxial film has been given as an example; however, as an element to be added to silicon, a Group IV element such as carbon (C) or tin (Sn) is preferable besides germanium (Ge). In this case, it is sufficient that at least one kind of such an element is added to silicon.

Also, the whole of the silicon germanium selection epitaxial film 26 is included in the channel impurity region 28; however, since the silicon germanium selection epitaxial film 26 serves to give a strain to the silicon selection epitaxial film 27, the silicon germanium selection epitaxial film 26 may have a part that is not included in the channel impurity region 28.

Fifth Embodiment

As a method of producing a semiconductor device according to the fifth embodiment of the present invention, another production method will be explained for the case of forming a silicon selection epitaxial film and a silicon germanium selection epitaxial film explained in the fourth embodiment.

Figure 32:
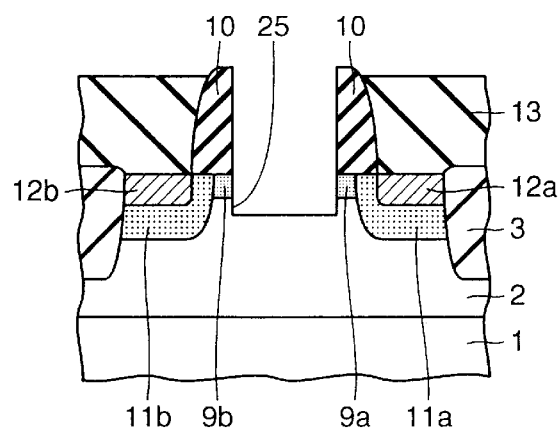
FIG. 32 is one cross-sectional view illustrating one step in a method for producing a semiconductor device according to a fourth embodiment of the present invention.
Figure 36:
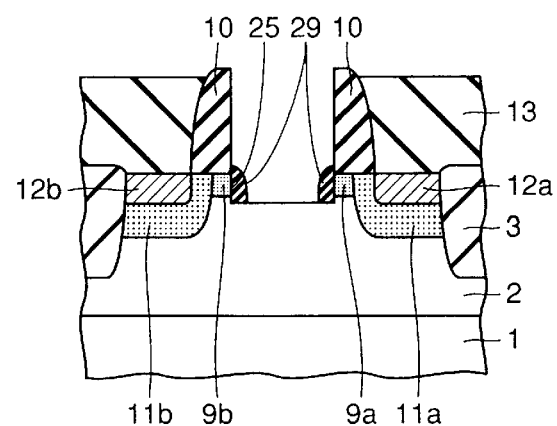
FIG. 36 is one cross-sectional view illustrating one step in a method for producing a semiconductor device according to a fifth embodiment of the present invention.

First, after the step shown in FIG. 32 and explained in the fourth embodiment, a silicon oxide film (not illustrated) is formed to cover the surface of the trench 25. The whole surface of the silicon oxide film is subjected to anisotropic etching to form a side wall silicon oxide film 29 on both side surfaces of the trench 25, as shown in FIG. 36.

Figure 37:
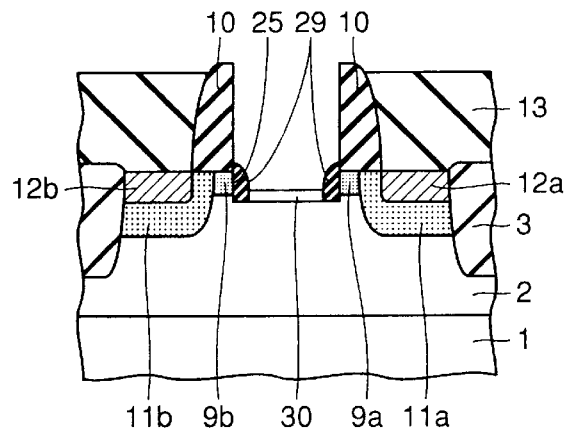
FIG. 37 is a cross-sectional view illustrating a step carried out after the step shown in FIG. 36 in this embodiment.

Next, referring to FIG. 37, a silicon germanium selection epitaxial film 30 is formed in the trench 25. At this time, since the side wall silicon oxide film 29 is formed on both side surfaces of the trench 25, the silicon germanium selection epitaxial film grows from the bottom surface of the trench 25. Here, the growth condition of the silicon germanium selection epitaxial film 30 is similar to the condition explained in the step shown in FIG. 33 in the fourth embodiment.

Figure 38:
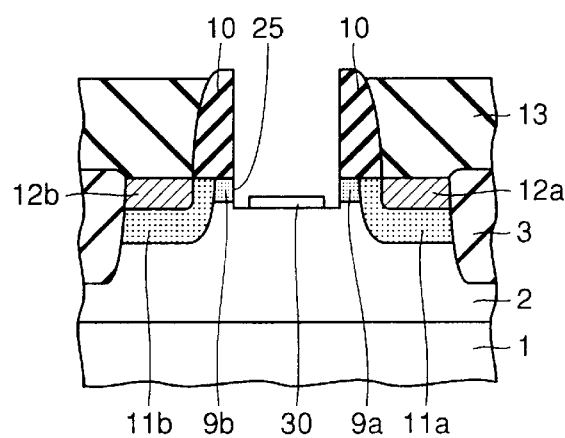
FIG. 38 is a cross-sectional view illustrating a step carried out after the step shown in FIG. 37 in this embodiment.

Next, referring to FIG. 38, the side wall silicon oxide film 29 is removed by carrying out wet etching or dry etching. At this time, it is sufficient that a part of the side wall silicon oxide film 29 located in a region immediately under the gate electrode in which the channel is to be formed is at least removed.

Figure 39:
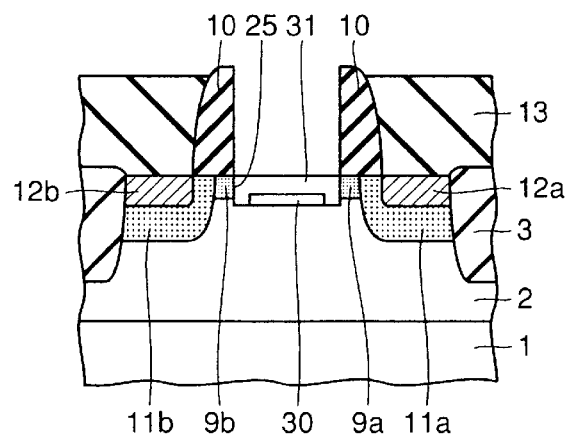
FIG. 39 is a cross-sectional view illustrating a step carried out after the step shown in FIG. 38 in this embodiment.

Next, referring to FIG. 39, a silicon selection epitaxial film 31 is formed to fill the trench 25. Here, the growth condition of the silicon selection epitaxial film 31 is similar to the condition explained in the step shown in FIG. 33 in the fourth embodiment.

Figure 40:
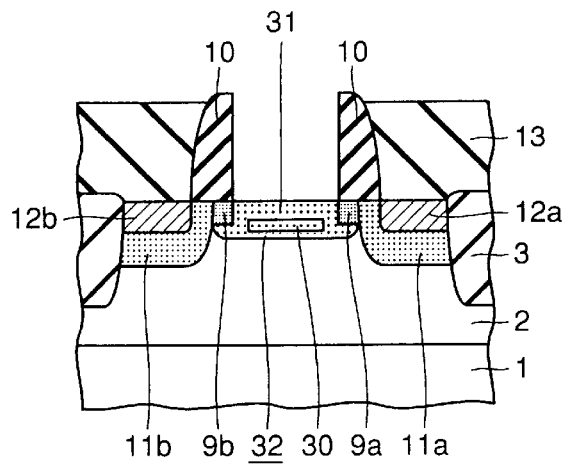
FIG. 40 is a cross-sectional view illustrating a step carried out after the step shown in FIG. 39 in this embodiment.

Next, referring to FIG. 40, a p-type impurity is implanted into the silicon selection epitaxial film 31 and the silicon germanium selection epitaxial film 30 by the ion implantation method, so as to form a channel impurity region 32.

Figure 41:
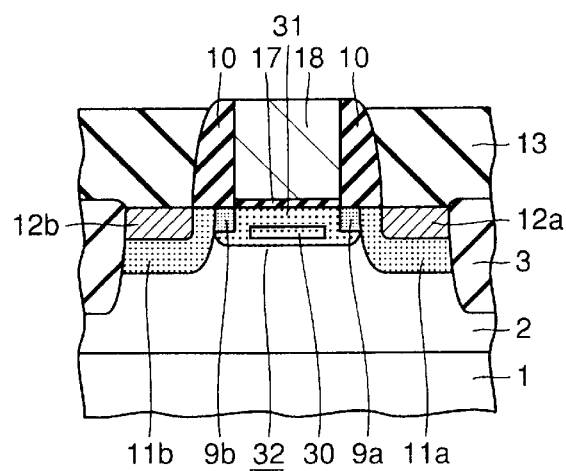
FIG. 41 is a cross-sectional view illustrating a step carried out after the step shown in FIG. 40 in this embodiment.

Next, referring to FIG. 41, a gate insulation film 17 is formed on the channel impurity region 32. A gate electrode 18 is formed on the gate insulation film 17. Thereafter, through a contact hole forming step, a wiring forming step, and others (none illustrated), the principal part of a semiconductor device including the field effect transistor is completed.

In the fourth embodiment, the silicon selection epitaxial film 27 is formed on the silicon germanium selection epitaxial film formed on the bottom surface and on the side surface of the trench 25 in the step shown in FIG. 33. For this reason, the silicon germanium selection epitaxial film 27 is present in a region where the channel is to be formed in the neighborhood of the region immediately under the gate electrode 18.

On the other hand, according to this method of producing a semiconductor device, since the side wall silicon oxide film 29 is formed on the side surface of the trench 25, the silicon germanium selection epitaxial film 30 grows from the bottom surface of the trench 25 and not from the side surface. For this reason, in the region where the channel is to be formed immediately under the gate electrode 18, the silicon selection epitaxial film 31 is present and the silicon germanium selection epitaxial film 30 is not present.

This allows all of the region where the channel is to be formed, i.e. the region where the carriers run, to be formed of the silicon selection epitaxial film 31. Moreover, since the silicon germanium selection epitaxial film 30 is located under the silicon selection epitaxial film 31 from one end to the other end of the channel, the strain can be given uniformly to the silicon selection epitaxial film 31. As a result of this, the mobility of the carriers is made uniform to stabilize the electrical characteristics of the transistor.

Sixth Embodiment

A method of producing a semiconductor device according to the sixth embodiment of the present invention will be explained.

As a method of producing a semiconductor device according to the sixth embodiment of the present invention, still another production method will be explained for the case of forming a silicon selection epitaxial film and a silicon germanium selection epitaxial film explained in the fourth embodiment.

Figure 42:
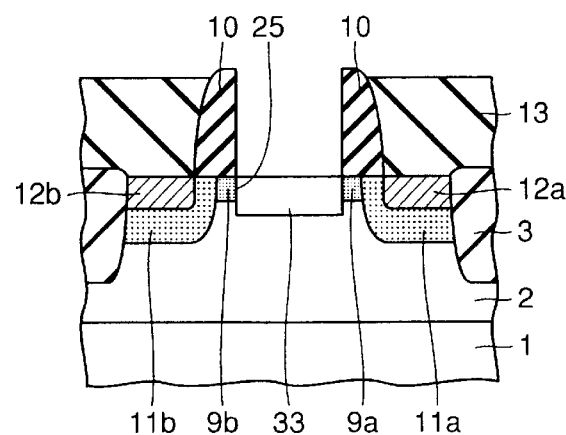
FIG. 42 is one cross-sectional view illustrating one step in a method for producing a semiconductor device according to a sixth embodiment of the present invention.

First, after the step shown in FIG. 32 and explained in the fourth embodiment, a silicon germanium selection epitaxial film 33 is formed to fill the trench 25, as shown in FIG. 42. Here, the growth condition of the silicon germanium selection epitaxial film 33 is similar to the condition explained in the step shown in FIG. 33 in the fourth embodiment.

Figure 43:
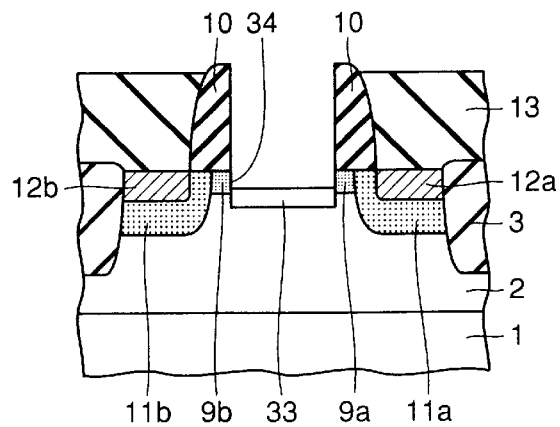
FIG. 43 is a cross-sectional view illustrating a step carried out after the step shown in FIG. 42 in this embodiment.

Next, referring to FIG. 43, the surface of the silicon germanium selection epitaxial film 33 and a neighboring part thereof are removed by carrying out wet etching or dry etching so as to form a trench 34.

Figure 44:
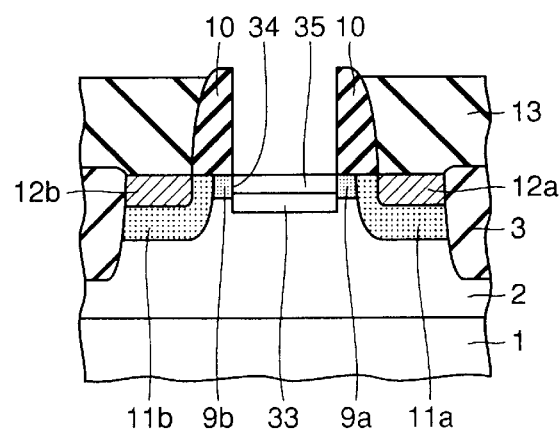
FIG. 44 is a cross-sectional view illustrating a step carried out after the step shown in FIG. 43 in this embodiment.
Figure 45:
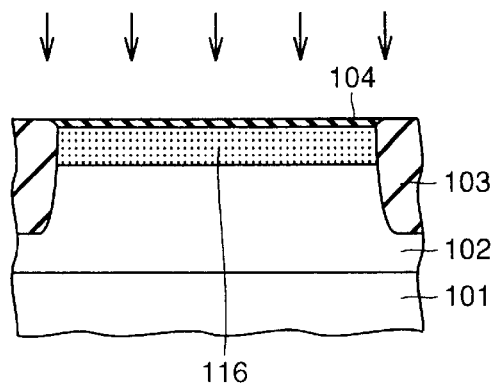
FIG. 45 is one cross-sectional view illustrating one step in a method for producing a conventional semiconductor device.
Figure 46:
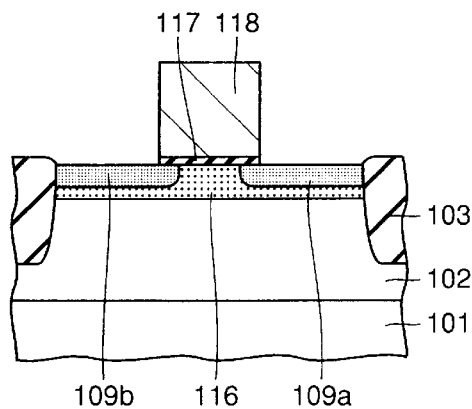
FIG. 46 is a cross-sectional view illustrating a step carried out after the step shown in FIG. 45.
Figure 47:
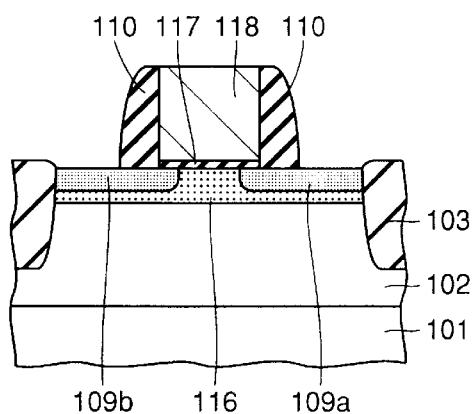
FIG. 47 is a cross-sectional view illustrating a step carried out after the step shown in FIG. 46.
Figure 48:
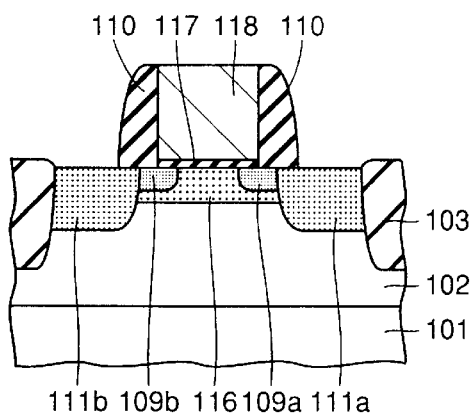
FIG. 48 is a cross-sectional view illustrating a step carried out after the step shown in FIG. 47.
Figure 49:
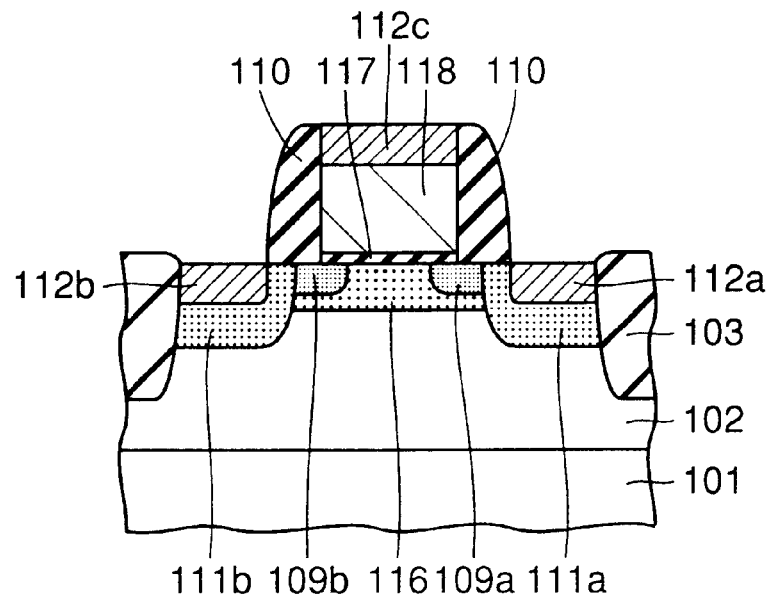
FIG. 49 is a cross-sectional view illustrating a step carried out after the step shown in FIG. 48.
Figure 50:
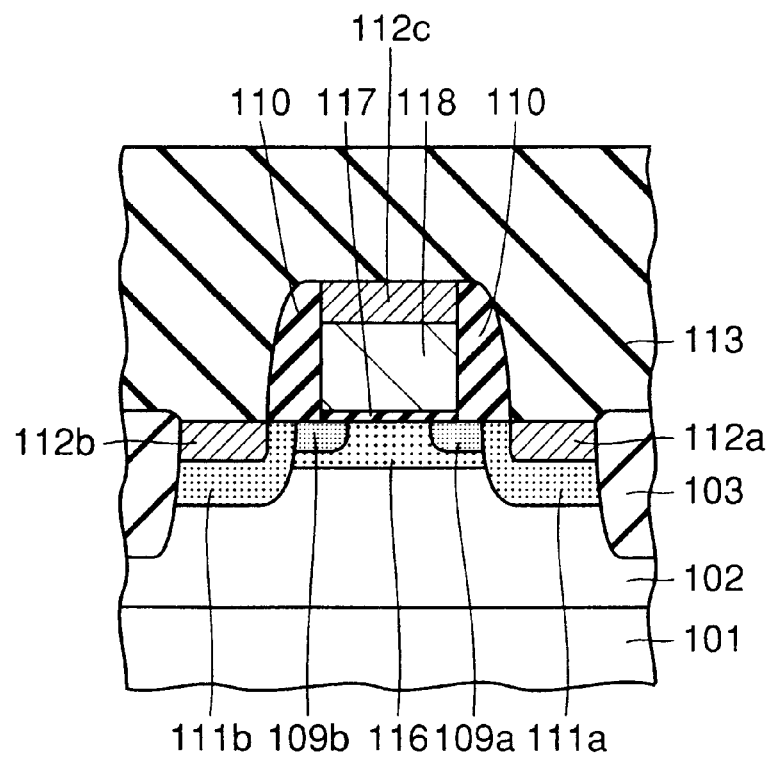
FIG. 50 is a cross-sectional view illustrating a step carried out after the step shown in FIG. 49.
Figure 51:
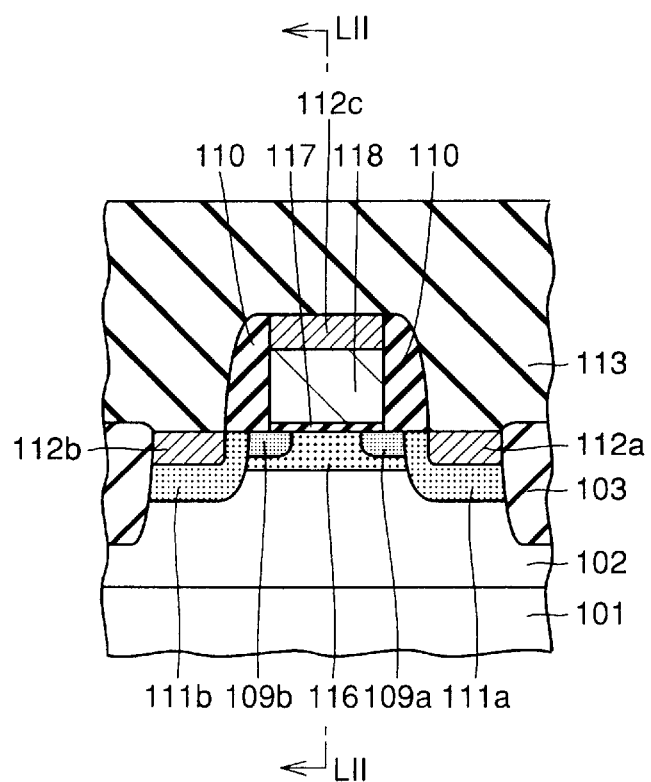
FIG. 51 is one cross-sectional view for explaining a problem in a conventional semiconductor device.
Figure 52:
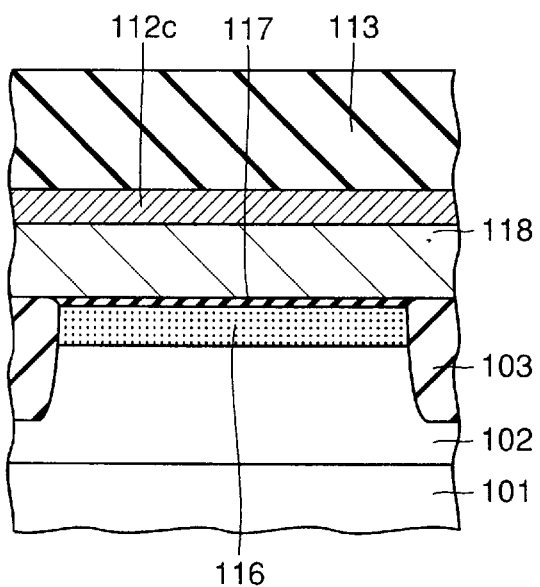
FIG. 52 is another cross-sectional view for explaining a problem in a conventional semiconductor device.
Figure 53:
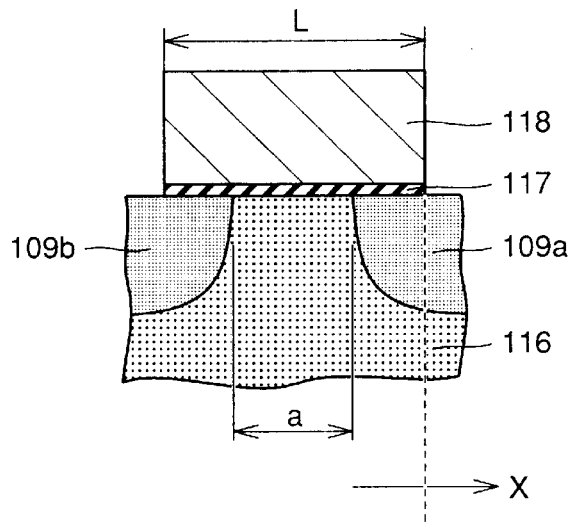
FIG. 53 is a partial enlarged cross-sectional view of the semiconductor device shown in FIG. 51.

Next, referring to FIG. 44, a silicon selection epitaxial film 35 is formed to fill the trench 34. Here, the growth condition of the silicon selection epitaxial film 35 is similar to the condition explained in the step shown in FIG. 33 in the fourth embodiment.

Thereafter, in the same manner as in the step shown in FIG. 40 and explained in the fifth embodiment, a p-type impurity is implanted into the silicon selection epitaxial film 35 and the silicon germanium selection epitaxial film 33 by the ion implantation method, so as to form a channel impurity region (not illustrated).

Next, in the same manner as in the step shown in FIG. 41 and explained in the fifth embodiment, a gate insulation film (not illustrated) is formed on the channel impurity region. A gate electrode (not illustrated) is formed on the gate insulation film. Thereafter, through a contact hole forming step, a wiring forming step, and others (none illustrated), the principal part of a semiconductor device including the field effect transistor is completed.

In this method of producing a semiconductor device, the silicon germanium selection epitaxial film 33 is formed in the trench 25 without forming the side wall silicon oxide film 29, when compared with the method of producing a semiconductor device explained in the fifth embodiment. This allows the silicon germanium selection epitaxial film 33 to be located to extend nearer to the region where the channel is to be formed.

As a result of this, the silicon germanium selection epitaxial film 33 can give a strain more uniformly to the silicon selection epitaxial film 35, whereby the mobility of the carriers is made more uniform to further stabilize the electrical characteristics of the transistor.

Here, in the aforesaid embodiments, explanation has been given on a field effect transistor of n-channel type as an example; however, the method of producing a semiconductor device according to the present invention can be applied to a field effect transistor of p-channel type as well. In this case, the extension regions and the source/drain regions are preferably formed by implanting boron or $BF_2$ as a p-type impurity. Further, the channel impurity region is preferably formed by introducing an n-type impurity such as phosphorus or arsenic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
   a silicon substrate having a surface;
   a pair of doped regions having a first conductivity type, spaced apart from each other, in the silicon substrate at the surface of the silicon substrate;
   a trench in the silicon substrate, at the surface of the silicon substrate, between the pair of doped regions, the trench having a bottom surface and side surfaces;
   a first film of silicon and a second film containing silicon as a first element and a second element other than silicon, the first and second films being located only in the trench, the first film being located on the second film, and the second film being in contact with the bottom surface of the trench and straining the first film;
   a gate insulation film at the surface of the silicon substrate, covering the trench, and in contact with the first film; and
   a gate electrode on the gate insulation film in a region sandwiched by the pair of doped regions.

2. The semiconductor device according to claim 1, wherein the second element is a Group IV element.

3. The semiconductor device according to claim 1, wherein the second element is an element having a lattice constant different from that of silicon.

4. The semiconductor device according to claim 1, wherein the second element is germanium.

5. The semiconductor device according to claim 1, wherein the second film covers the bottom surface and the side surfaces of the trench.

6. The semiconductor device according to claim 1, wherein the first film contacts the bottom surface of the trench and covers the side surfaces of the trench.

7. The semiconductor device according to claim 1, wherein the second film covers the bottom surface of the trench and contacts the side surfaces of the trench and the first film contacts the side surfaces of the trench.

* * * * *